United States Patent [19]

Ohwaki et al.

[11] 4,157,611
[45] Jun. 12, 1979

[54] PACKAGING STRUCTURE FOR SEMICONDUCTOR IC CHIP AND METHOD OF PACKAGING THE SAME

[75] Inventors: Seishiro Ohwaki, Hinodemachi; Motoharu Ogawa, Kokubunji, both of Japan

[73] Assignee: Hitachi, Ltd., Japan

[21] Appl. No.: 776,923

[22] Filed: Mar. 11, 1977

[30] Foreign Application Priority Data

Mar. 26, 1976 [JP] Japan .................................. 51-32558

[51] Int. Cl.$^2$ ............................................ B01J 17/00
[52] U.S. Cl. ........................................ 29/588; 357/73
[58] Field of Search ..................... 29/588; 357/72, 73, 357/74, 80

[56] References Cited

U.S. PATENT DOCUMENTS

| 3,059,158 | 10/1962 | Doucette et al. | 29/588 |
| 3,308,525 | 3/1967 | Tsuji et al. | 29/588 |
| 3,684,818 | 8/1972 | Netherwood | 357/80 |
| 3,781,976 | 1/1974 | Tomiwa | 29/588 |
| 3,885,860 | 5/1975 | Sorkin | 29/588 |

Primary Examiner—Gerald A. Dost
Attorney, Agent, or Firm—Craig and Antonelli

[57] ABSTRACT

A packaging structure for a semiconductor IC chip, in which lead electrodes connected with the chip are extended out through a binding agent filled in a sealing gap, characterized in that in the vicinity of the lead electrodes the outer surface of the binding agent is recessed with respect to the outer surface of the packaging or sealing members.

5 Claims, 9 Drawing Figures

PACKAGING STRUCTURE FOR SEMICONDUCTOR IC CHIP AND METHOD OF PACKAGING THE SAME

This invention relates to a packaging structure for a semiconductor IC chip and a method of packaging a semiconductor IC chip.

A variety of packaging structures have been put into practice for the purpose of sealing IC chips. Of those structures, the dual inline type glass-sealed structure (hereinafter written for brevity a DIL-G structure) is very widely used since it is inexpensive, reliable and simple in configuration in comparison with the other sealing structures.

The DIL-G structure is as shown in cross section in FIG. 1 and assembled as follows. A ceramic base 1 is heated to soften the layer of glass 2 having a low melting point and applied on the base 1. To the ceramic base 1 are adhered discrete bracket-shaped lead frames 3 and an IC chip 4. The bonding pad electrodes of the IC chip 4 are connected with the corresponding lead electrodes of the lead frames 3 by fine metal wire 5. The thus assembled structure is capped with a ceramic cap 6 and sealed with glass 2a of low melting point.

Since the DIL-G structure uses the discrete bracket-shaped lead frames 3, special jigs for supporting the lead frames 3 in such specific shape are needed and therefore the assembly process is complicated and also requires many steps.

In order to reduce the production cost of an IC through the decrease in labor and through automatization in the assembly process of such a DIL-G structure, a DIL-G structure has been proposed which uses a lead frame 3a as shown in FIG. 2 consisting of plural flat leads coupled together, instead of discrete bracket-shaped lead frames 3 as shown in FIG. 1. However, the DIL-G structure shown in FIG. 2 has a drawback as follows. After the sealing step, the leads of the lead frame 3a are to be bent according to the predetermined specification. During the bending step, it sometimes happens that gaps are formed between the leads and the low melting point glass 2, 2a as sealing agent or that cracks are formed in the glass 2, 2a, as shown in FIG. 3. Accordingly, the sealing property is degraded in the sealing glass layer so that the reliability becomes degraded.

It is therefore an object of this invention to provide packaging structures for semiconductor IC chips which have a high reliability, are free from the above mentioned drawback and are adapted for automatic sealing. It is another object of this invention to provide a method of packaging the above structure.

According to this invention, which has been made to attain the above object, there is provided a packaging structure for a semiconductor IC chip in which lead electrodes connected with the semiconductor IC chip are extended out through the binding agent filled in a sealing gap, characterized in that in the vicinity of the lead electrodes the outer surface of the binding agent is recessed with respect to the outer surface of the packaging or sealing members. The other objects and advantages will be clarified when the following description of this invention is read in connection with the attached drawings, in which:

Figure 1:
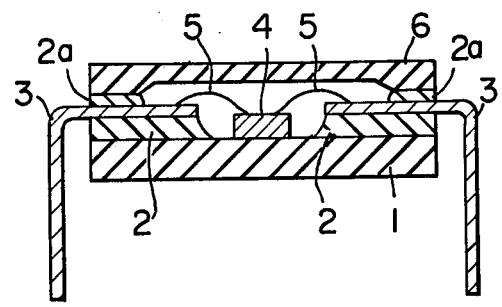
FIGS. 1 to 3 show in cross section conventional electronic devices.
Figure 2:
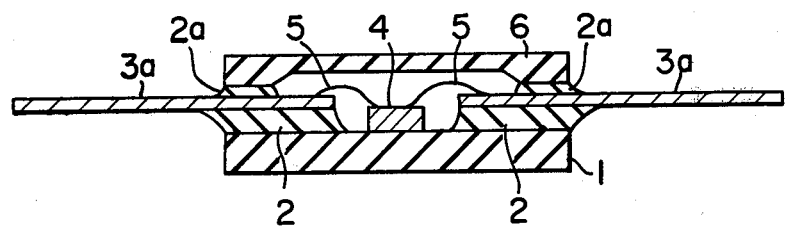
Figure 3:
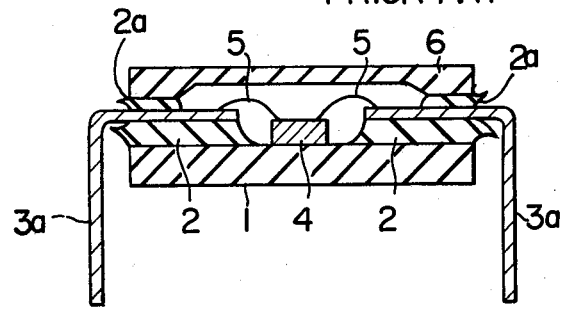
Figure 4:
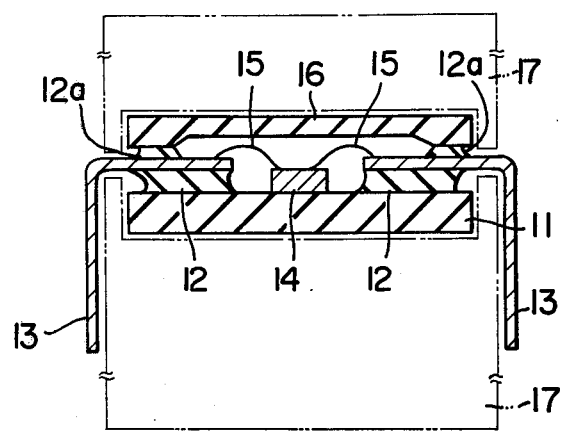
FIG. 4 shows in cross section semiconductor IC according to this invention.

This invention will now be described concretely by way of embodiments with the aid of the attached drawings. In FIG. 4, reference numerals 11 indicate ceramic bases; 12, 12a glass of low melting point; 13 a lead frame; 14 a semiconductor IC chip; 15 bonding wire, e.g. fine metal wire; 16 a ceramic cap; and 17 jigs for supporting the semiconductor IC when the leads of the lead frame 13 are bent.

Figure 5:
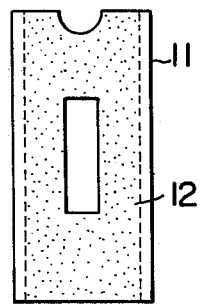
FIGS. 5 and 7 are plans of ceramic bases used as a part of a package according to this invention.
Figure 6:
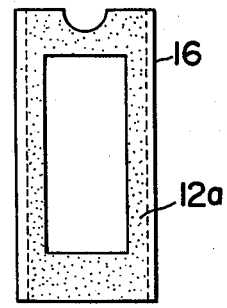
FIGS. 6 and 8 are bottom views of ceramic caps used as a part of a package according to this invention.
Figure 7:
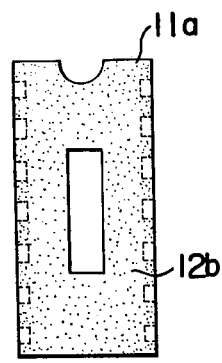
Figure 8:
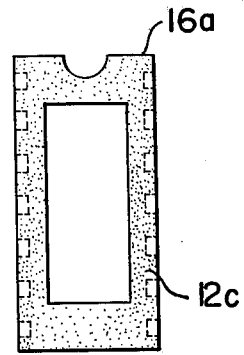

The method of mounting the semiconductor IC according to this invention will be described below. On the confronting surfaces of the ceramic base 11 and the ceramic cap 16 of the package is applied a mixture solution of glass consisting of glass powder, solvent such as aluminum acetate and binder such as cellulose, the glass mixture having a low melting point and a predetermined viscosity and being applied to a thickness of 0.2–0.3 mm. After sintering treatment, a ceramic base 11 and a ceramic cap 16 having respectively the layers of low melting point glass 12 and 12a are prepared as shown in FIGS. 5 and 6. In this case, the glass layers 12 and 12a are not made respectively on the parts of the ceramic base 11 and the ceramic cap 16 recessed by less than about 0.1 mm from the respective both ends from which the leads of the lead frame 13 are derived. This configuration is essential for the reason that the ends of the glass layers 12 and 12a should not extend beyond the edges of the ceramic base 11 and cap 16 when the base 11, the cap 16 and the lead frame 13 are bound by the low temperature melting glass 12 and 12a. Therefore, numerous variations or modifications may be adoptable without departing from the scope of this invention if only the essential requirement, i.e. the provision of the narrower glass layer, is taken into consideration. For example, it is possible not to apply the glass 12 and 12a to those portions of the ceramic base 11a and cap 16a where the lead frame 13 is to be located, as shown in FIGS. 7 and 8.

The ceramic base 11 having the low temperature melting glass layer 12 of the above-mentioned shape is subjected to heat treatment and the lead frame 13 and the semiconductor IC chip 14 are fastened to the ceramic base 11 through the softening of the glass layer 12 due to heat. The bonding pads of the semiconductor chip 14 are connected respectively with the corresponding lead electrodes of the lead frame 13 by fine metal wires 15 such as aluminum wire. The ceramic cap 16 is fastened for sealing to the above prepared structure by means of the low temperature melting glass 12a.

As seen in FIG. 4, the semiconductor IC sealed within the ceramic base 11 and ceramic cap 16 is supported by the jigs 17 and the flat lead electrodes are bent. The unwanted portions of the lead frame 13 are removed by cutting so that a semiconductor IC is completed.

As described above, according to the semiconductor IC embodying this invention, the ends of the glass layers 12 and 12a do not extend beyond the edges of the ceramic base 11 and the ceramic cap 16 so that the jigs 17 can be set without touching the glass layers 12 and 12a, no matter what shapes the glass layers may have, when the leads are bent. Therefore, no harmful external force is exerted on the exposed portions of the glass layers 12 and 12a so that cracks and/or gaps are not formed in the portions and that the glass layers 12 and 12a are prevented from being broken. Accordingly, the hermetic sealing is not degraded and therefore a semiconductor IC having a high reliability can be obtained.

Figure 9:
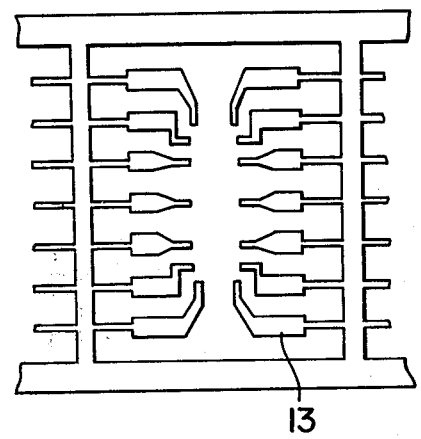
FIG. 9 is a plan of a lead frame according to this invention.

Moreover, since the semiconductor IC according to this invention can use a flat lead frame 13 consisting of plural lead electrodes coupled together as shown in FIG. 9, the mounting process can be completely automatized, resulting in the reduction in labor and production cost.

This invention is by no means limited to the embodiments described above and shown in the attached drawings, but permits of other applications to various electronic devices.

We claim:

1. A method of packaging a semiconductor IC chip, comprising the steps of:
    (a) the step of applying a mixture solution of glass having a low melting point on the confronting peripheral surfaces of a ceramic base and a ceramic cap disposed face to face, said glass being recessed so as to be spaced by a predetermined distance from outer edges of said ceramic base and cap in at least those portions of said base and cap where said lead frame is to be disposed, and said glass not being applied to that portion of said base and cap where said semiconductor IC chip is to be located;
    (b) the step of sintering the thus prepared ceramic base and cap;
    (c) the step of heating said ceramic base to soften said glass so that said semiconductor IC chip and said lead frame may be fastened to said ceramic base;
    (d) the step of connecting the bonding pads of said semiconductor IC chip with the corresponding leads of said frame by fine metal wires;
    (e) the step of fastening said ceramic cap to said ceramic base with said lead frame and said IC chip thereon by means of said glass for sealing said IC chip and a portion of said lead frame wherein said glass layer does not extend outwardly beyond said outer edges of both said ceramic base and said ceramic cap along said lead frame; and
    (f) the step of supporting said semiconductor IC chip sealed within said ceramic base and cap by jigs, bending the external leads of said lead frame, and removing the unwanted portions of said lead frame by cutting.

2. A method for manufacturing a semiconductor device having first and second ceramic members, at least one glass layer binding said first and second ceramic members to seal a semiconductor chip therebetween, and lead members extending from the assembly of said ceramic members through said glass layer and being bent in the vicinity of said glass layers, comprising the steps of:
    applying a glass mixture of a low melting point on facing peripheral surfaces of said first and second ceramic members but spaced from at least portions of outer edges of said ceramic members;
    sintering said ceramic members and glass mixture applied thereto to form said glass layer respectively on said members;
    heating said first ceramic member with lead members disposed on said glass layer to bind said lead members to said first ceramic member;
    placing said second ceramic member on said first ceramic member so that the glass layer of said second ceramic member contacts said lead members bound to said first ceramic member;
    heating the thus obtained assembly to bind said second ceramic member to said first ceramic member by the respective glass layers; and
    bending said lead members while holding said lead members in the vicinity of the outer edges of said ceramic members with holding means,
    wherein said glass layers are formed at a spacing from said holding means which are holding said lead members.

3. A method for manufacturing a semiconductor device according to claim 1, wherein in said applying step said glass mixture is applied on the peripheral surfaces of said ceramic members so as to be spaced from only portions of said outer edges across which the lead members extend.

4. A method for manufacturing a semiconductor device according to claim 1, wherein in said applying step said glass mixture is applied on the peripheral surfaces of said ceramic members so as to be spaced at a predetermined distance from the outer edges of said ceramic members.

5. A method for manufacturing a semiconductor device according to claim 1, wherein said bending step is carried out by placing said holding means adjacent to said outer edges of said ceramic members without touching said glass layers.

* * * * *